United States Patent [19] [11] 4,227,187
McNamara et al. [45] Oct. 7, 1980

[54] HIGH SPEED REAL TIME QUANTIZER AND ANALOG/DIGITAL CONVERTER

[75] Inventors: John V. McNamara, Rome; Paul Van Etten, Clinton, both of N.Y.

[73] Assignee: The United States of America as represented by the Secretary of the Air Force, Washington, D.C.

[21] Appl. No.: 25,413

[22] Filed: Mar. 30, 1979

[51] Int. Cl.³ .............................................. H03K 13/00
[52] U.S. Cl. ................................ 340/347 P; 313/372; 340/347 M; 340/796; 315/378; 358/252
[58] Field of Search ....... 340/347 AD, 347 M, 347 P, 340/360, 794–797; 313/372; 358/252; 315/378

[56] References Cited
U.S. PATENT DOCUMENTS

| 3,071,762 | 1/1963 | Morgan | 340/347 P |
| 3,360,672 | 12/1967 | Marshall | 358/252 X |
| 3,400,391 | 9/1968 | Rantsch et al. | 340/347 P X |
| 3,581,102 | 5/1971 | Nagao | 313/372 X |
| 3,873,868 | 3/1975 | Robinder | 358/252 X |
| 4,034,363 | 7/1977 | Van Etten et al. | 340/347 P |

FOREIGN PATENT DOCUMENTS 2155077 5/1973 Fed. Rep. of Germany .... 252/301.4 F

Primary Examiner—Thomas J. Sloyan
Attorney, Agent, or Firm—Joseph E. Rusz; Willard R. Matthews

[57] ABSTRACT

A system for performing real time quantization and analog/digital conversion of an analog waveform operating with analog input signals over one gigahertz bandwidth is realized by utilizing a CRT type device in which the electron beam is deflected by the analog input waveform. The deflected electron beam strikes a fast phosphor screen and an externally positioned target consisting of light sensitive elements arranged in a discrete pattern detects and quantizes the signal. The output of the detectors feed an encoder resulting in a binary digital output waveform. The device accepts both unipolar and bipolar video waveform and has parallel output channels such that further circuitry to be employed can operate with reduced bandwidths.

4 Claims, 7 Drawing Figures

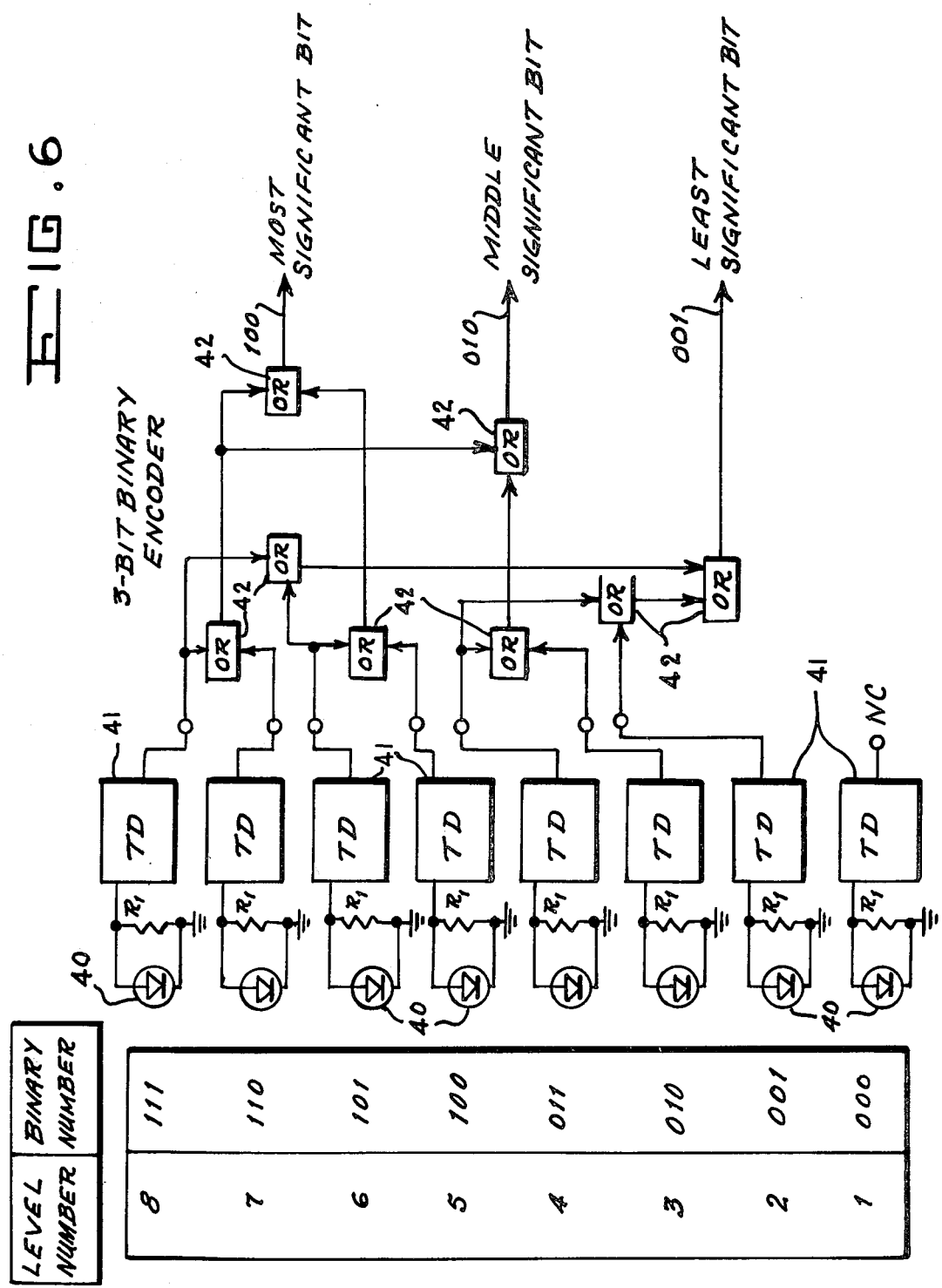

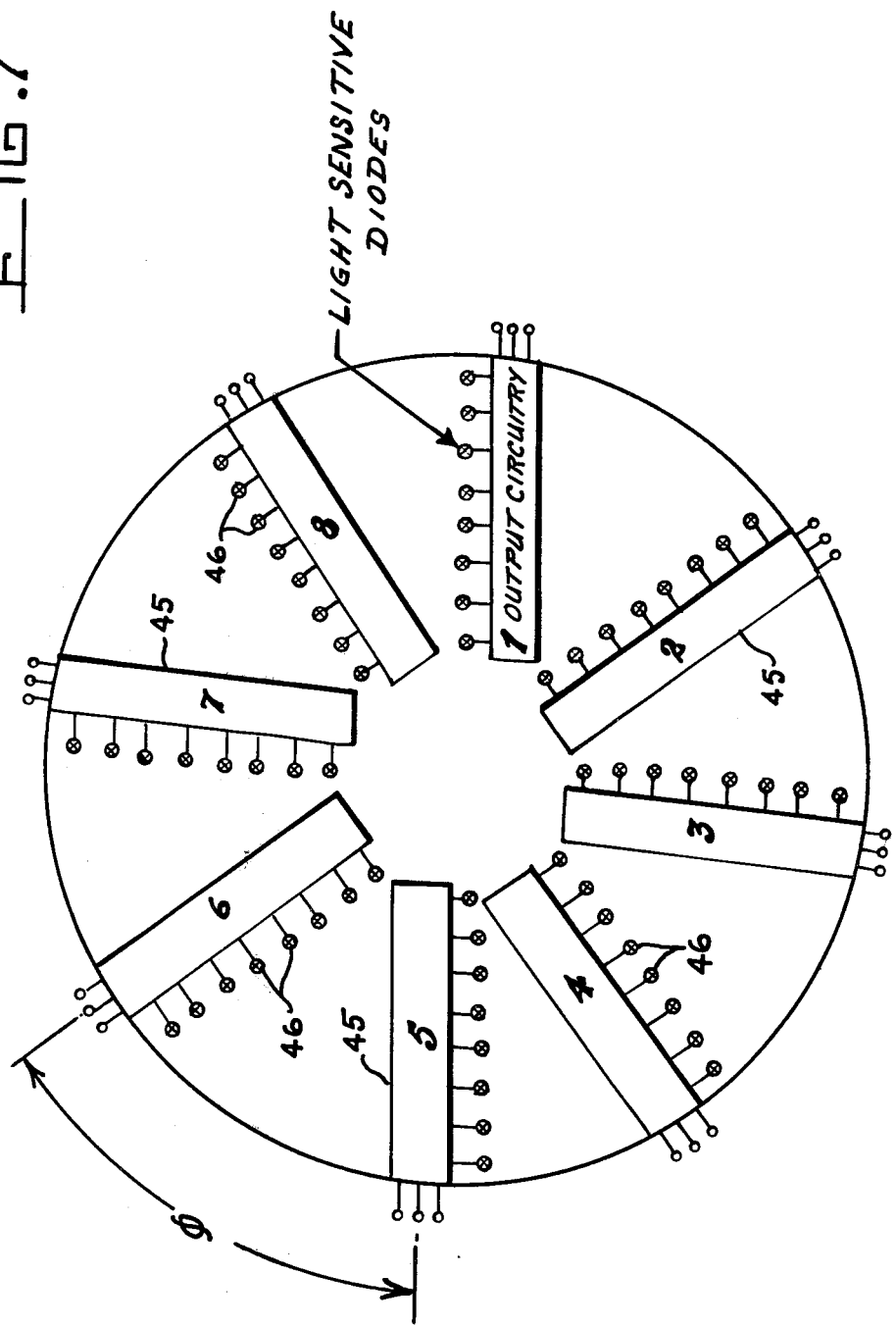

HIGH SPEED REAL TIME QUANTIZER AND ANALOG/DIGITAL CONVERTER

STATEMENT OF GOVERNMENT INTEREST

The invention described herein may be manufactured and used by or for the Government for governmental purposes without the payment of any royalty thereon.

BACKGROUND OF THE INVENTION

This invention relates to signal processing systems and in particular to means for the quantization and analog/digital conversion of analog signals.

Military and commercial electronic systems frequently require quantization or analog/digital conversion of analog signals. Such functions are common for communications systems, radar systems and systems in general which employ digital processing or the operation of digital computers from analog inputs.

State-of-the-art circuits for accomplishing these ends are often subject to one or more of various limitations which include: not operating in real time; not being able to perform quantization and A/D conversion for large input signal bandwidths; requiring large bandwidths for follow up circuitry; and the inability to operate on both unipolar and bi-polar video waveforms.

A substantial improvement in the quantization and analog/digital conversion of analog signals has been provided by the system disclosed in U.S. Pat. 4,034,363 entitled *REAL TIME DATA RATE QUANTIZER AND ANALOG-TO-DIGITAL CONVERTER* by Paul Van Etten and John V. McNamara. The device disclosed in that patent, however, utilizes a mosaic target of electron beam sensitive elements that are positioned within a vacuum element. The manufacturing techniques necessary to include functional elements within the vacuum enclosure together with various other construction problems associated with such a geometry detract appreciably from the device's utility and add substantially to its cost.

The present invention is an improvement of the device disclosed in U.S. Pat. No. 4,034,363 and it eliminates the various construction problems while retaining all other advantages over prior art devices.

SUMMARY OF THE INVENTION

The quantizer and analog/digital converter of the invention comprehends a CRT type unit having a fast phosphor screen, means for deflecting the electron beam of the unit to display a trace on the screen that is a function of an inputted analog signal, a target of discretely arranged light sensitive diodes that detects the trace and quantizes the modulating signal, and a binary encoder that provides a binary digital output from the outputs of the light sensitive diodes.

The beam deflecting plates of the CRT type unit are controlled by a beam deflecting signal that effects a circular beam trace of a given diameter on the phosphor screen. The analog input signal further modulates the beam deflecting signal causing excursions from the circular trace that are functions of the analog input signal. The target is a mosaic of light detectors arranged in concentric rings with angular symmetry. Quantization of the input signal is accomplished by actuating individual light detectors as a function of time and amplitude with each sector of the target corresponding to a specific time interval of the input signal and each segment of the target corresponding to a finite range in amplitude. A fiber optics face plate enhances the transmission of light from the phosphor screen to the target light detectors and a light filter is used to eliminate unwanted slow response time illumination. The target and encoder circuitry are external to the beam and phosphor screen enclosing vacuum envelope.

It is a principal object of the invention to provide a new and improved device for performing quantization and analog/digital conversion of an analog input waveform.

It is another object of the invention to provide a device of the type described that works in real time and that can perform quantization or analog/digital conversion with bandwidths exceeding one gigahertz.

It is another object of the invention to provide a high speed real time quantizer and analog/digital converter having an n-channel output in which the bandwidth of each channel is reduced by I/N times the bandwidth of a single channel output.

It is another object of the invention to provide a high speed real time quantizer and analog/digital converter having a parallel channel output that will allow circuitry following the device to have reduced bandwidths.

It is another object of the invention to provide a high speed real time quantizer and analog/digital converter than can be inputted with either unipolar or bipolar video waveforms and with either positive or negative unipolar waveforms.

It is another object of the invention to provide a high speed real time quantizer and analog/digital converter that is easier to manufacture and less costly than currently available devices.

These together with other objects, features and advantages of the invention will become more readily apparent from the following detailed description when taken in conjunction with the illustrative embodiment in the accompanying drawings.

DESCRIPTION OF THE DRAWINGS

FIG. 6 is a block diagram of the electronic output circuitry for one complete target spoke; and, FIG. 7 illustrates a mosaic target with output circuit integration on mosaic.

DETAILED DESCRIPTION OF THE PREFERRED EMBODIMENT

The invention is a device concept for performing quantization or A/D conversion of an analog waveform. The device of the invention works in a real time (e.g. continuous) and can operate with analog input signals with over one GHz bandwidth. Further, the device has parallel output channels such that further circuitry to be employed with the device can operate with reduced bandwidth. For "N" output channels the effective bandwidth of each channel is reduced to 1/N times the bandwidth of the input signal.

Figure 1:
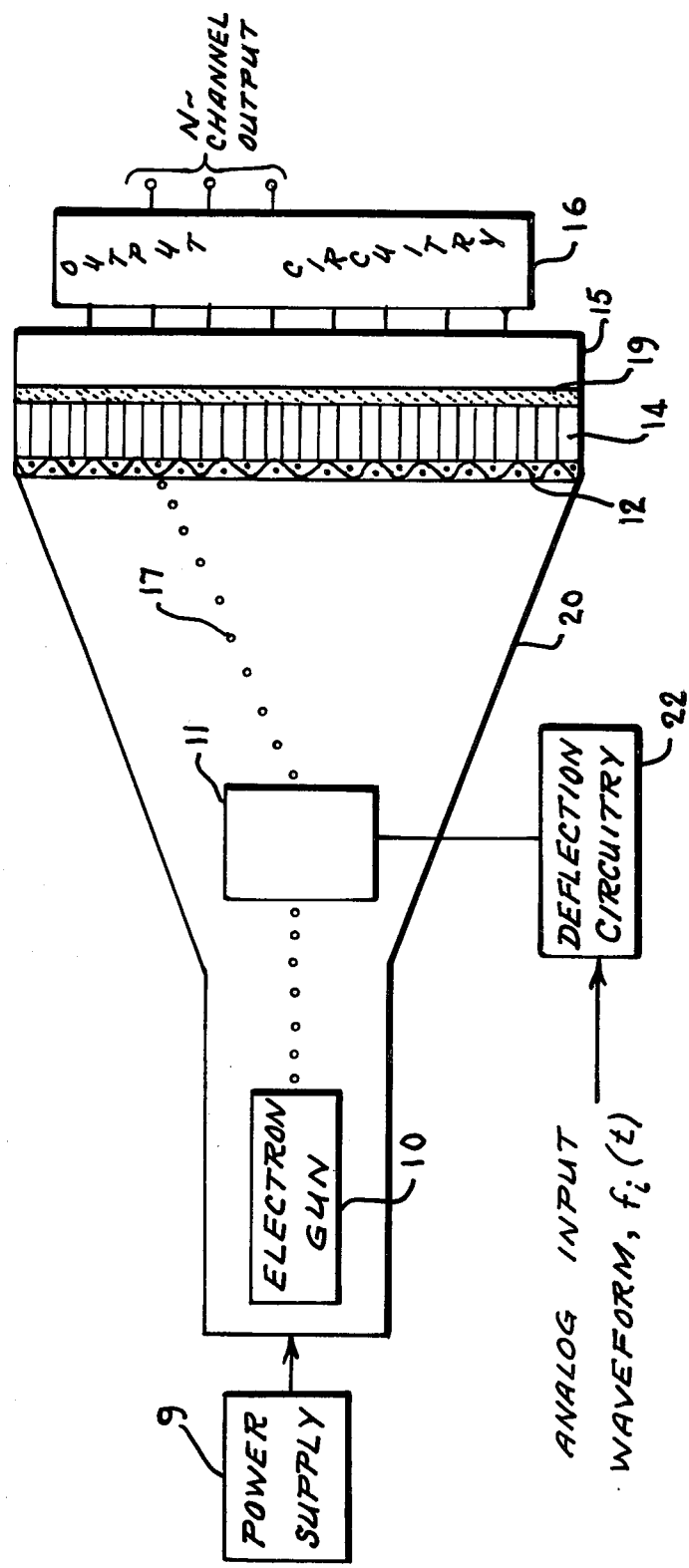
FIG. 1 is a schematic representation of the high speed real time quantizer and analog/digital converter of the invention.

The structure and operating principles of the High-Speed Real-Time Quantizer and A/D Converter are described with reference to FIGS. 1-7. Referring to FIG. 1, the device consists of an electron gun 10 deflection structure 11, phosphor screen 12, fiber optics face plate 14, and a target mosaic 15 with its output circuit 16. The electron gun operating from power supply 9 produces an electron beam 17 with a typical energy of 10,000 electron volts and a spot size on the mosaic target of the order of one mil diameter. The electron beam is of constant energy; i.e., the beam is not amplitude modulated. The electron beam passes through the deflection structure 11 and is deflected as described in the discussion of the deflection circuitry to follow. The beam then impinges on the phosphor screen producing light. The light passes through the fiber optics face plate 14 through the light filter 19 to the light sensitive elements in the target mosaic, from which the output signals are derived and are further processed in the output circuitry 16. In this configuration the target mosaic is outside of vacuum envelope 20 of the cathode-ray tube. The physical appearance of the device, for example, might look like a conventional cathode-ray tube with a mosaic target structure attached to the cathode-ray tube face. The electron gun required for this device is well within the present state-of-the-art and therefore does not require a detailed discussion. The electron beam formed by the electron gun is of constant intensity and is passed through the deflection structure. Various forms of deflection structures such as magnetic or electrostatic deflection can be employed to deflect the electron beam. Many of the deflection techniques can be employed in this device, however, simple electrostatic deflection will be used here to aid in the description of the operation.

In operation the deflection structure and deflection circuitry 22 produces a rotating beam such that the beam will impinge on the target in a circular pattern. As the input waveform is increased in magnitude, the diameter of the circular pattern on the target is increased proportionally.

Figure 2:
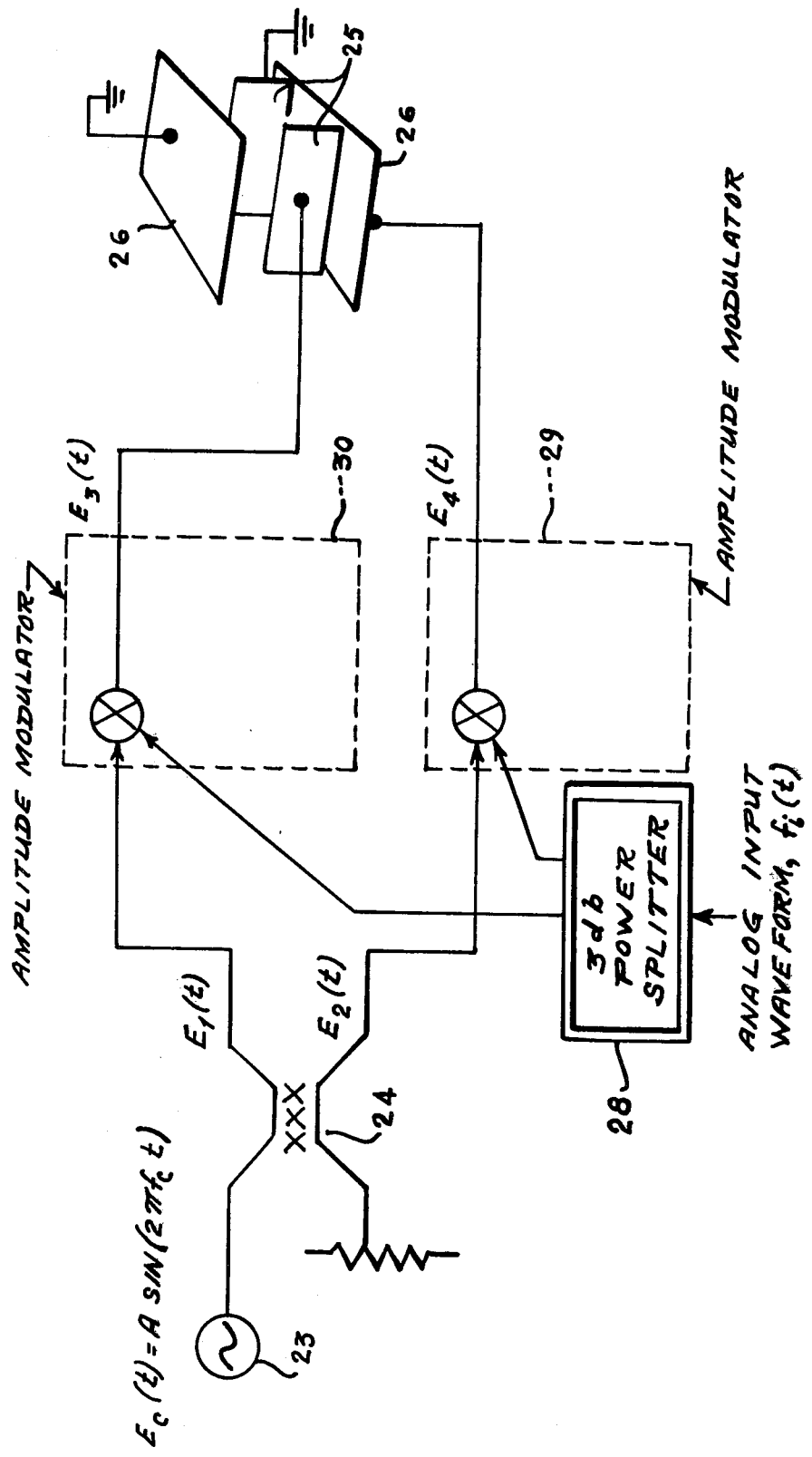
FIG. 2 is a schematic diagram of the deflection circuitry of the device of FIG. 1.

A typical deflection circuit is discussed with reference to FIG. 2. Here the deflection oscillator 23 of frequency $f_c$ feeds a 3 dB coupler 24 such that the two outputs are 90° out of phase. If the deflection oscillator 23 is a sinusoid with output $E_c = A \sin \omega t$, then two outputs of the coupler are $E_1 = 1/\sqrt{2} \ A \sin \omega t$ and $E_2 = 1/\sqrt{2} \ A \cos \omega t$. If $E_1$ feeds the horizontal deflection plates 25 and $E_2$ feeds the vertical deflection plates 26 the electron beam rotates, producing a circular pattern on the target (say, in a clockwise direction). By reversing the inputs (i.e., $E_1$ and $E_2$) the electron beam can be made to rotate in the opposite or counter clockwise, direction.

Figure 3:
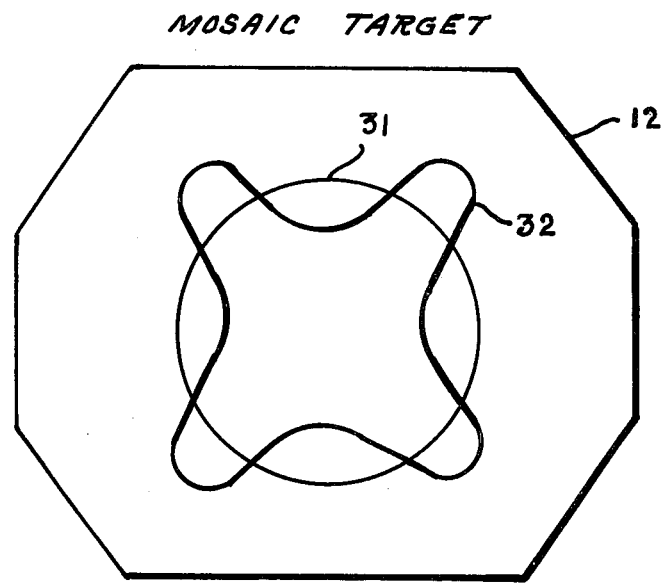
FIG. 3 illustrates typical light beam traces (with and without an input signal) on the target of the device of FIG. 1.

The quadrature signals described above are amplitude modulated by the analog input signal to the device, $f_i$. Two equal amplitude equal phase signals are derived from $f_i$ by a simple power splitter 28 and drive a modulator 29, 30 for each of the quadrature signals. A typical amplitude modulator, such as that shown in FIG. 2, is a simple mixer. Other amplitude modulators may be employed whereas the one shown is used merely as an example. The output of the amplitude modulators ($E_3$ and $E_4$) are $E_3 = K\ f_i(t) \sin (2\pi f_c t)$ and $E_4 = K\ F_i(t) \cos (2\pi f_c t)$ where the factor K includes the signal loss of the amplitude modulators. The trace of the electron beam on the target is seen in FIG. 3. With a zero input signal the trace of the electron beam is a circle (trace 31) where the radius is adjusted by setting the output level of the deflection oscillator shown in FIG. 2. Also shown, for example, is the electron beam trace of a sinusoidal waveform input with a frequency of four times that of the deflection oscillator (trace 32).

The response of the phosphor screen 12 must be fast because of the short dwell time of the electron beam upon a point on the screen. Phosphors such as Lanthum, Yttrium and Yttrium Silicate all doped with Cerium have the desired response time. Because the spot size of the light emitting from the phosphor screen may disperse, a standard fiber-optics face plate 14 is employed to transfer the small light spot to the exterior of the cathode-ray tube.

Because some fast phosophors also emit light at a slower response time and at a different frequency a light filter 19 may be included to block the slower response-time light.

Figure 4:
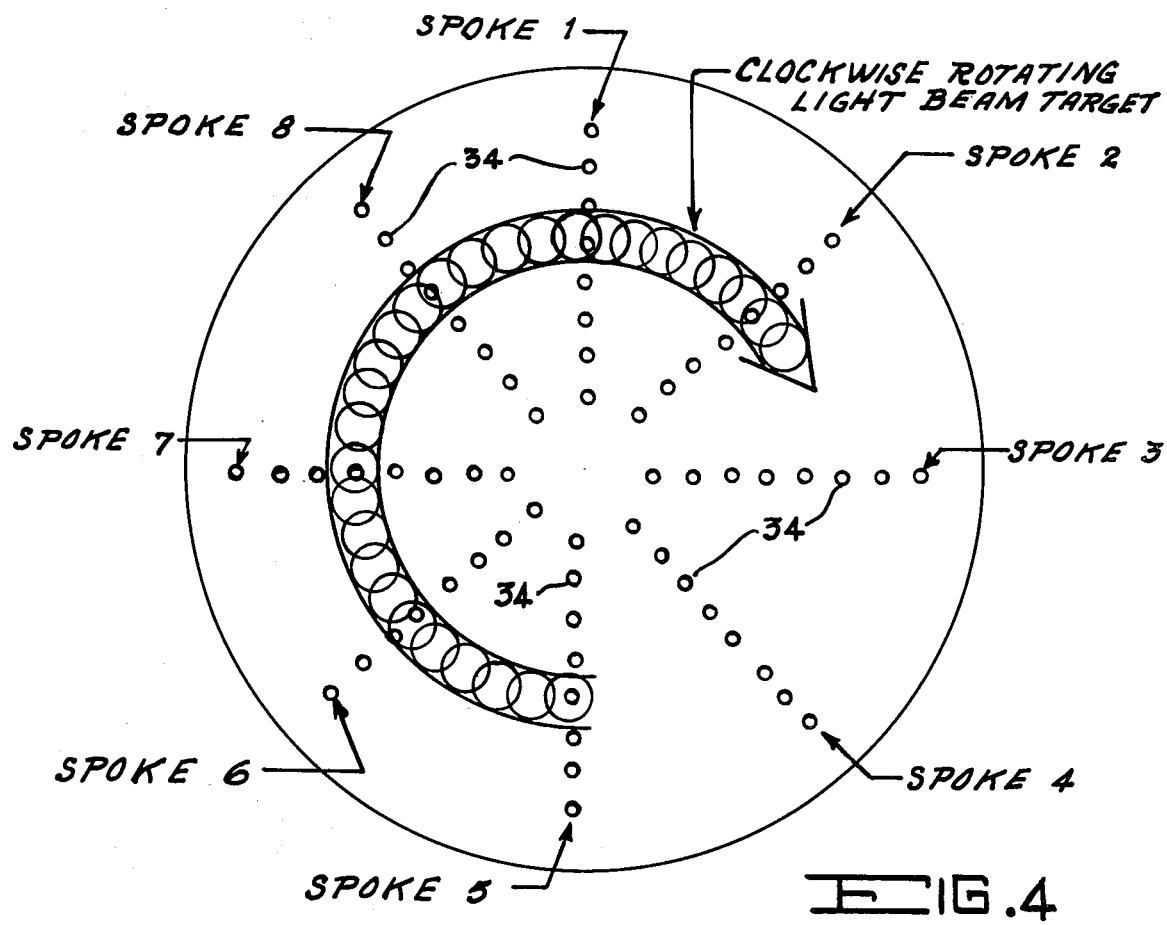
FIG. 4 is a front view of a mosaic eight spoke target showing a light beam trace.

The target 15 consists of a mosaic of light sensitive detectors 34 arranged in annular rings with angular symmetry as shown in FIG. 4. Each wedge shaped piece is called a sector. The number of sectors required for Nyquist sampling is $$N \geq 2 \ \frac{f_{max}}{f_c} \tag{1}$$

N = No. of sectors
$f_{max}$ = maximum frequency component of the analog input signal
$f_c$ = deflection oscillator frequency.

For an n-bit A to D converter each sector will consist of $2^n$ segments each being a separate electron beam sensitive device. Such a sector will make a $2^n$ level quantizer. The radial dimension of the segments in each sector can be varied to allow for non-linearities in the deflection system or to intentionally cause nonlinear A-D conversion or quantization.

Since the electron beam is rotating at an angular frequency $\omega_c$, the time, $T_1$, for the beam to move across a sector of angular dimension $\theta$ (FIG. 4) is $$T_1 = \theta/\omega_c \tag{2}$$

The light sensitive diodes 34 can be any of several commercially available designs which have a total response time less than the period of beam rotation, $T_c = 2\pi/\omega_c$.

The electron beam encodes the information contained in the analog input signal on to the phosphor and mosaic target; each sector corresponding to a specific time interval of the input signal and each segment corresponding to a finite range in amplitude of the analog input signal. The signal is thus quantized in time and amplitude. Since the sweep time (Equation 2) across a particular sector can be as short as a few picoseconds, a means of storing the target response (holding circuit) for a time compatible with state-of-the-art output and logic circuitry may be required. There is a time constant associated with the response of the phosphor, filter and light sensitive diode structure ($T_2$). Generally the time constant can be made sufficiently long, such that no holding circuit will be required. It is necessary, however, for the time constant to be shorter than one period of revolution of the electron beam.

Figure 5:
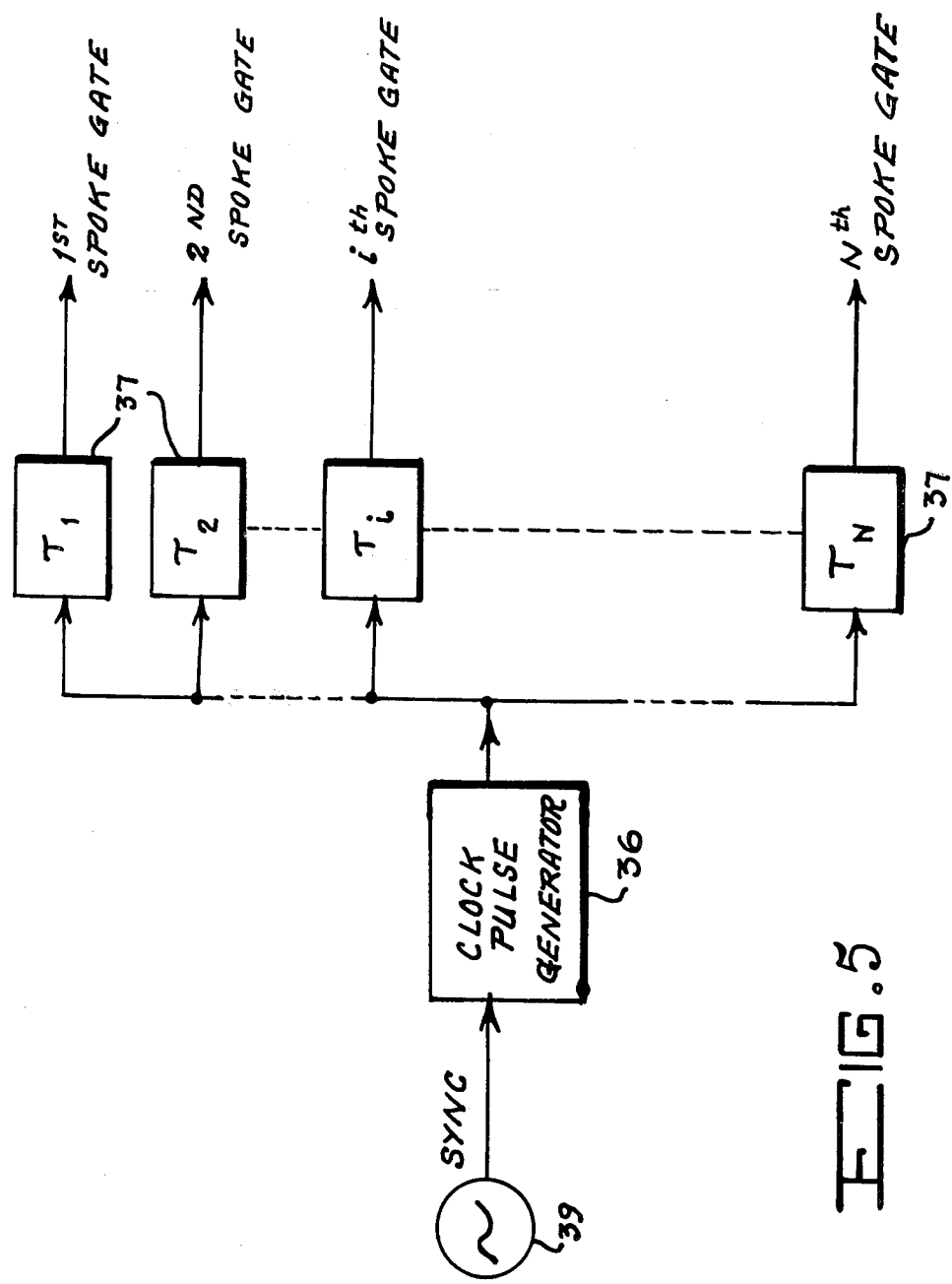
FIG. 5 is a block diagram of synchronous spoke gate timing circuitry.

The digital output circuitry must be clocked in synchronism with the rotation of the electron beam. One of many ways this can be accomplished is shown in FIG. 5. A clock pulse generator 36 is excited by the deflection oscillator 37. Clock pulses are fed through a network of delay lines 37 to the logic circuitry for each sector, where the delay for the $i^{th}$ sector is given by $$\rightarrow T_i = \frac{2\pi}{\omega_c} \cdot \frac{i}{N}.$$

To operate the device as an A/D converter, a binary encoder is required to encode the quantizated amplitude to binary format. An example is shown in FIG. 6 for a three bit encoder which comprises light detector 40, threshold detector 41, and OR gate 42. Here the only logic circuitry employed is the "OR" circuit. With this encoder the output will register the higher of any quantizated level in the event that the electron beam scans across two adjacent levels. This may happen when the signal amplitude is changing rapidly and is near the division between two adjacent levels (segments).

If the light spot should scan along the space between two adjacent levels it may miss both segments and hence the level will not register. To overcome this problem a technique called gap filling is employed. Gap filling is accomplished by spacing the segments less than the spot diameters such that the light spot will always excite at least one but never more than two segments in each sector. In the event that two segments are illuminated (i.e., the $i^{th}$ and the $i^{th}+1$) the encoder shown in FIG. 6 will automatically select the greater level.

The mosaic target can be easily assembled using conventional fabrication technology. The output circuitry shown in FIG. 6 may be integrated with the mosaic target as shown by the integrated output circuit 45 and the light sensitive diodes 46 of FIG. 7. This can be accomplished by using either monolithic or hybrid technology. FIG. 7 has 8 sectors each with a 3 bit output.

By way of example, the following is a target design for a 4 bit, 1 GHz A/D converter using a silicon semiconductor diode light sensing element.

A convenient deflection oscillator frequency is 200 MHz. From Equation 1, the number of sectors required for Nyquist sampling is 10.

A margin above the Nyquist criteria is usually desired therefore N=12 is chosen.

The number of segments required for a 4 bit A/D converter is $2^4=16$.

Choose the recovery time $T_2$ of the semiconductor diode, the phosphor and filter to be 90% of the period of the deflection oscillator, $T_2=4\times10^{-9}$ seconds.

The size of the light spot projected onto the mosaic target will be 10 mils. This results in a sector spacing of 8 mils, and a total target diameter = ½ inch.

There are numerous possible parameter trade-offs in the design of such a device. Table I lists the parameters of the above design along with a range of parameters which are considered practical using modern technology.

TABLE I

| Design Feature | Design | Practical Limit |
|---|---|---|
| Target diameter | ½ inch | 3 inches |
| Number of Segments, N | 12 | <40 |
| Number of Bits | 4 | <11 |
| Number of Segments/Sector | 16 | <2048 |
| Deflection oscillator Frequency | 200 MHz | ~500 MHz |
| Maximum Input Frequency | 1 GHz | Unknown |

TABLE I-continued

| Design Feature | Design | Practical Limit |
|---|---|---|
| Electron Beam Diameter | 10 mils. | >0.5 mil. |

While the invention has been described in its preferred embodiment it is understood that the words which have been used are words of description rather than words of limitation and that changes within the purview of the appended claims may be made without departing from the scope and spirit of the invention in its broader aspects.

What is claimed is:

1. A real time large data rate quantizer and analog-to-digital converter for an input analog waveform being comprised of an electron gun providing a constant high energy electron beam, a fast phosphor cathode ray tube screen, a mosaic target of light sensitive detectors arranged in annular rings, and in juxtaposed light receiving relationship to said cathode ray tube screen, said mosaic target having a preselected number of sectors, each sector being in the form of a wedge shaped piece, each sector including a preselected number of segments, each segment being a separate light sensitive device, each sector corresponding to a specific time interval of said input analog signal and each segment corresponding to a finite range in amplitude of said input analog waveform, a fiber optics face plate between said mosiac target and said fast phosphor cathode ray tube screen transmitting light therebetween, light filter means adjacent said mosaic target for blocking slow response time light emanating from said screen, a vertical and horizontal beam deflecting structure, vertical and horizontal beam deflection circuitry means connected to said vertical and horizontal beam deflection structure and operating in combination therewith to effect impingement of said electron in a circular pattern on said fast phosphor cathode ray tube screen, said vertical and horizontal beam deflecting circuitry means receiving said input analog waveform to provide an increasing diameter of said circular pattern in accordance with an increasing magnitude of said input analog waveform, said vertical and horizontal beam deflecting circuitry means including a power splitter receiving said input analog waveform and providing first and second split signals, a deflection oscillator, a quadrature coupler connected to said deflection oscillator and providing first and second oscillator deflection signals therefrom, first and second amplitude modulators, said first amplitude modulator receiving said first split signal and said first oscillator deflection signal, and second amplitude modulator receiving said second split signal and said second oscillator deflection signal, said first and second amplitude modulators providing first and second deflection signals to said vertical and horizontal beam deflection structure, a vacuum envelope for said electron gun, said vertical and horizontal beam deflection structure and said fast phosphor cathode ray tube screen, and a binary encoder circuit receiving the outputs of said light detectors to provide a binary digital output waveform.

2. A real time large data rate quantizer and analog to digital converter as defined in claim 1 wherein said fast phosphor cathode ray tube screen comprises a cerium doped Lanthum screen.

3. A real time large data rate quantizer and analog to digital converter as defined in claim 1 wherein said fast phosphor cathode ray tube screen comprises a cerium doped Yttrium screen.

4. A real time large data rate quantizer and analog to digital converter as defined in claim 1 wherein said fast phosphor cathode ray tube screen comprises a cerium doped Yttrium Silicate screen.

* * * * *